United States Patent
Vogt et al.

(10) Patent No.: US 7,882,452 B2
(45) Date of Patent: Feb. 1, 2011

(54) MODELING SILICON-ON-INSULATOR STRESS EFFECTS

(75) Inventors: Eric E. Vogt, Maple Grove, MN (US); Greg A. Michaelson, Shakopee, MN (US)

(73) Assignee: Honeywell International Inc., Morristown, NJ (US)

( * ) Notice: Subject to any disclaimer, the term of this patent is extended or adjusted under 35 U.S.C. 154(b) by 582 days.

(21) Appl. No.: 11/847,999

(22) Filed: Aug. 30, 2007

(65) Prior Publication Data

US 2009/0064062 A1    Mar. 5, 2009

(51) Int. Cl.
*G06F 17/50* (2006.01)
(52) U.S. Cl. .......................................................... 716/1
(58) Field of Classification Search ................. 716/1–18
See application file for complete search history.

(56) References Cited

U.S. PATENT DOCUMENTS

| 6,627,511 B1 | 9/2003 | Racanelli et al. ............ 438/404 |
| 6,774,395 B1 | 8/2004 | Lin et al. ....................... 257/48 |
| 7,132,683 B1 | 11/2006 | Krishnan et al. .............. 257/40 |
| 2006/0090146 A1 | 4/2006 | LeBritton et al. ............... 716/4 |
| 2007/0028195 A1* | 2/2007 | Chidambarrao et al. ........ 716/2 |
| 2007/0033559 A1 | 2/2007 | Fulkerson ....................... 716/5 |

FOREIGN PATENT DOCUMENTS

| JP | 2003174172 A * | 6/2003 |
| WO | WO 2007/016183 A2 | 2/2007 |

OTHER PUBLICATIONS

Su et al., "Modeling Isolation-induced Mechanical Stress Effect on SOI MOS Devices", International IEEE SOI Conference, Sep. 29, 2003, pp. 80-82.*
Su et al., "Modeling Isolation-Induced Mechanical Stress Effect on SOI MOS Devices," 2003 IEEE, p. 80-82.

* cited by examiner

*Primary Examiner*—Vuthe Siek
*Assistant Examiner*—Aric Lin
(74) *Attorney, Agent, or Firm*—Shumaker & Sieffert, P.A.

(57) ABSTRACT

A method and system for modeling silicon-on-insulator shallow trench isolation stress effect is described. The method includes creating instance parameters that define dimensions of a body-tie enclosure of gate and gate-end. The instance parameters are added to a netlist. The netlist and a lookup table are used to generate a mobility multiplier. The mobility multiplier is added to the netlist and a circuit simulation program runs the netlist having the instance parameters and the mobility multiplier.

19 Claims, 4 Drawing Sheets

```
//SETUP THE SWA SLA

// if no bodytie on one end, then size gate by 0.005 so enc_per doesn't fail
sizegate = SIZE poly_int BY 0.005 INSIDE OF diff // size diff inside gate to get rid of sw div by 0 when nothing encloses gate end
sizediff = SIZE diff BY 0.005 INSIDE of poly_int // size difftap by -0.005 to get a better estimation of the width direction numbers
// Use 0.005 or Calibre will not see a smaller value
difftap005 = SIZE difftap BY -0.005

// btdiffw = OR bodytie difftap005
btdiff = OR sizegate (OR bodytie (OR difftap005 sizediff))
```

Fig. 4

MODELING SILICON-ON-INSULATOR STRESS EFFECTS

FIELD

The present invention relates generally to modeling stress effects, and more particularly, relates to modeling stress effects in silicon-on-insulator (SOI) processes.

BACKGROUND

Shallow trench isolation (STI) is an integrated circuit feature that prevents electrical current leakage between adjacent semiconductor device components. However, STI structures can cause a compressive stress effect in the silicon in which a Metal Oxide Semiconductor Field Effect Transistor (MOSFET) channel region is located. This phenomenon is generally known as STI stress effect. STI stress effect can cause drive current variation in MOSFETs or, when excess amounts are present, can result in device leakage or other defects.

The STI stress effect in bulk MOS processes is commonly modeled with a standard BSIM4 SPICE model. SPICE (Simulation Program with Integrated Circuit Emphasis) is a general purpose circuit simulator. The Berkeley Short-Channel IGFET Model (BSIM) is a standard model for MOSFET circuit simulation and technology development. BSIM4, the current version of this model, addresses the MOSFET physical effects into sub-100 nm regime. Unfortunately, this model is not suitable for modeling SOI STI stress effect.

SOI devices are similar to devices formed in bulk silicon in that they both have a source, a drain, and a gate structure. SOI devices, however, are formed in a substrate that has a buried isolation region formed below the device layer. This buried isolation region is typically formed by implanting the silicon substrate with oxygen to create a silicon dioxide region, which is commonly referred to as the Separation by Implantation of Oxygen (SIMOX) process.

The buried isolation region reduces or eliminates many of the parasitic problems common to devices formed in bulk silicon. Although the buried isolation region eliminates the need for implanted wells to isolate device components, isolation structures, such as STI structures, are still necessary between neighboring devices. As a result, SOI devices are also susceptible to STI stress effect.

Some efforts have also been made to model isolation stress effects on SOI devices. In one such effort, the stress effect was approximated using a 1/LOD model, where LOD is the length of the outside diameter (OD) of the active region as defined by the device layout. See Ke-Wei Su, "Modeling Isolation-Induced Mechanical Stress Effect on SOI MOS Devices," SOI Conference, Sep. 29-Oct. 2, 2003, IEEE International, pp. 80-82. However, this effort did not consider the impact of a body-tie, which can impact the stress of the MOSFET.

Thus, it would be beneficial to have an SOI model for modeling the STI stress effect that takes into consideration a body-tie.

SUMMARY

A method and system for modeling silicon-on-insulator shallow trench isolation effect is described. The method includes creating instance parameters that define dimensions of a body-tie enclosure of gate and gate-end (or dimensions of a silicon enclosure of gate and gate-end); adding the instance parameters to a netlist; generating a mobility multiplier using the netlist; adding the mobility multiplier to the netlist; and running a circuit simulation program with the netlist that includes the instance parameters and the mobility multiplier.

Creating the instance parameters may include using a well proximity effect capability. For example, creating the instance parameters may include using Calibre's well proximity effect capability.

Creating instance parameters preferably includes creating eight instance parameters, but more or less than eight instance parameters may be created. Some of the parameters may be used for stress extraction in a direction of current flow, while others may be used for stress extraction perpendicular to a direction of current flow.

The method may further include creating dimensions of the body-tie enclosure of gate-end when the body-tie does not enclose the gate-end.

Generating the mobility multiplier may further include using a table containing empirical data for mobility variation as a function of the instance parameters, a length of an active area of a transistor, and a width of the active area of the transistor. Alternatively, generating the mobility multiplier may further include using an equation that accounts for mobility variation as a function of the instance parameters, a length of an active area of a transistor, and a width of the active area of the transistor.

Running the circuit simulation program with the netlist that includes the instance parameters and the mobility multiplier may include running a SPICE model.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein:

FIG. 4 is sample code for use with the flow chart for modeling STI stress effect in SOI technology depicted in FIG. 1, according to an example.

DETAILED DESCRIPTION

Figure 1:
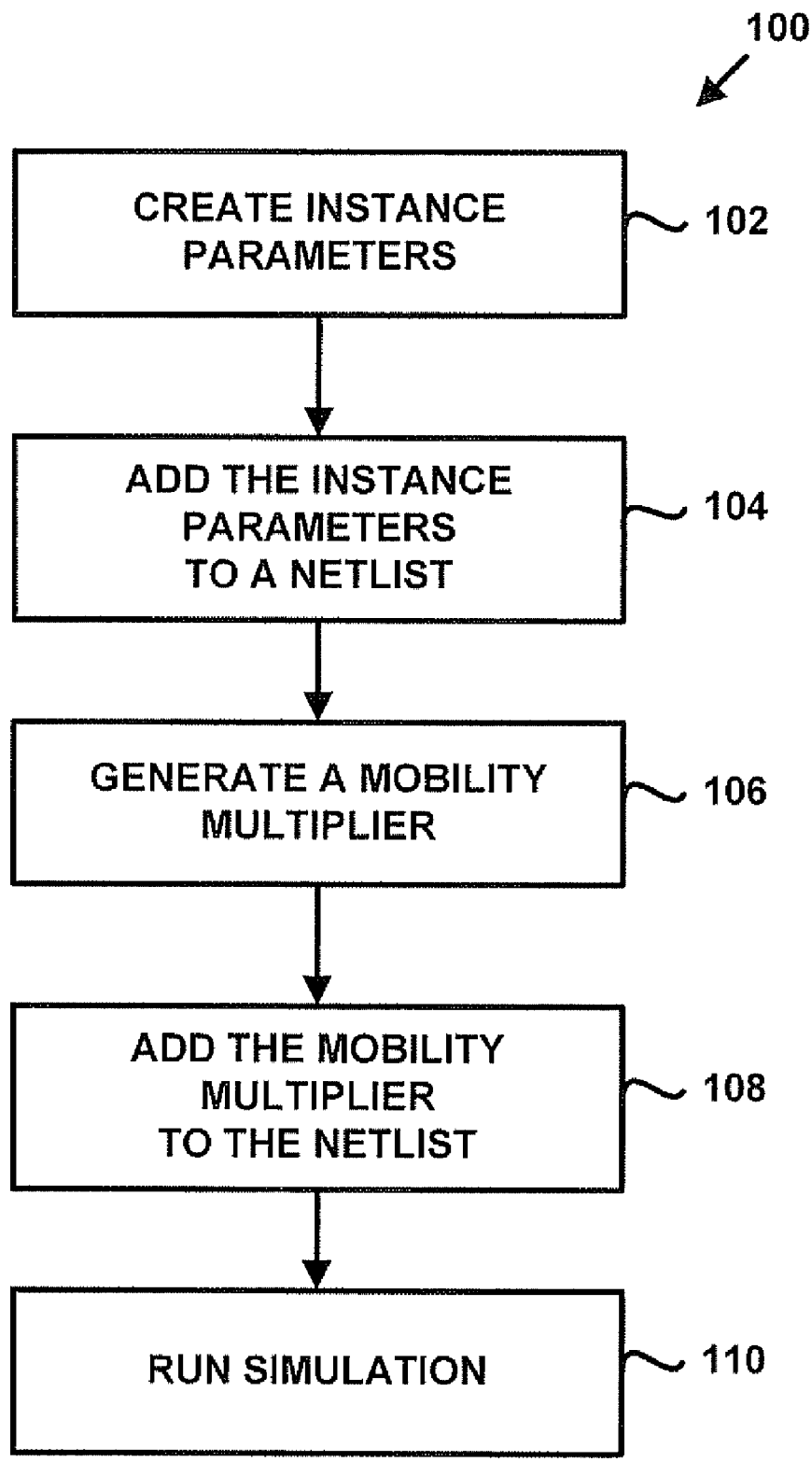
FIG. 1 is a flow chart of a method for modeling STI stress effect in SOI technology, according to an example.

The STI stress effect in SOI is a complex function of diffusion enclosure of gate, MOSFET width (W), MOSFET length (L), and body-tie enclosure of gate and gate-end. FIG. 1 is a flow chart of a method 100 for modeling STI stress effect in SOI technology. The method 100 may be run on one or more processors using software stored in one or more memory devices. The invention is not limited to any processor or memory type.

At block 102, instance parameters are created. Instance parameters are physical quantities that describe the transistor, such as MOSFET length and width of the active area (L and W). Preferably, the method 100 uses Calibre's well proximity effect capability to create the instance parameters for a SPICE netlist to describe the body-tie enclosure of gate and gate-end.

Calibre® is a software program available from Mentor Graphics Corporation for verifying that a netlist has been properly transformed to a device layout. Calibre's well proximity effect capability is unrelated to STI stress effect. Instead, the well proximity effect capability is typically used to determine well implant mask area. Additionally, this capability may be used to model and/or modify threshold voltage $V_{th}$. Other software programs having well proximity effect capability or a similar capability may also be used.

Figure 2:
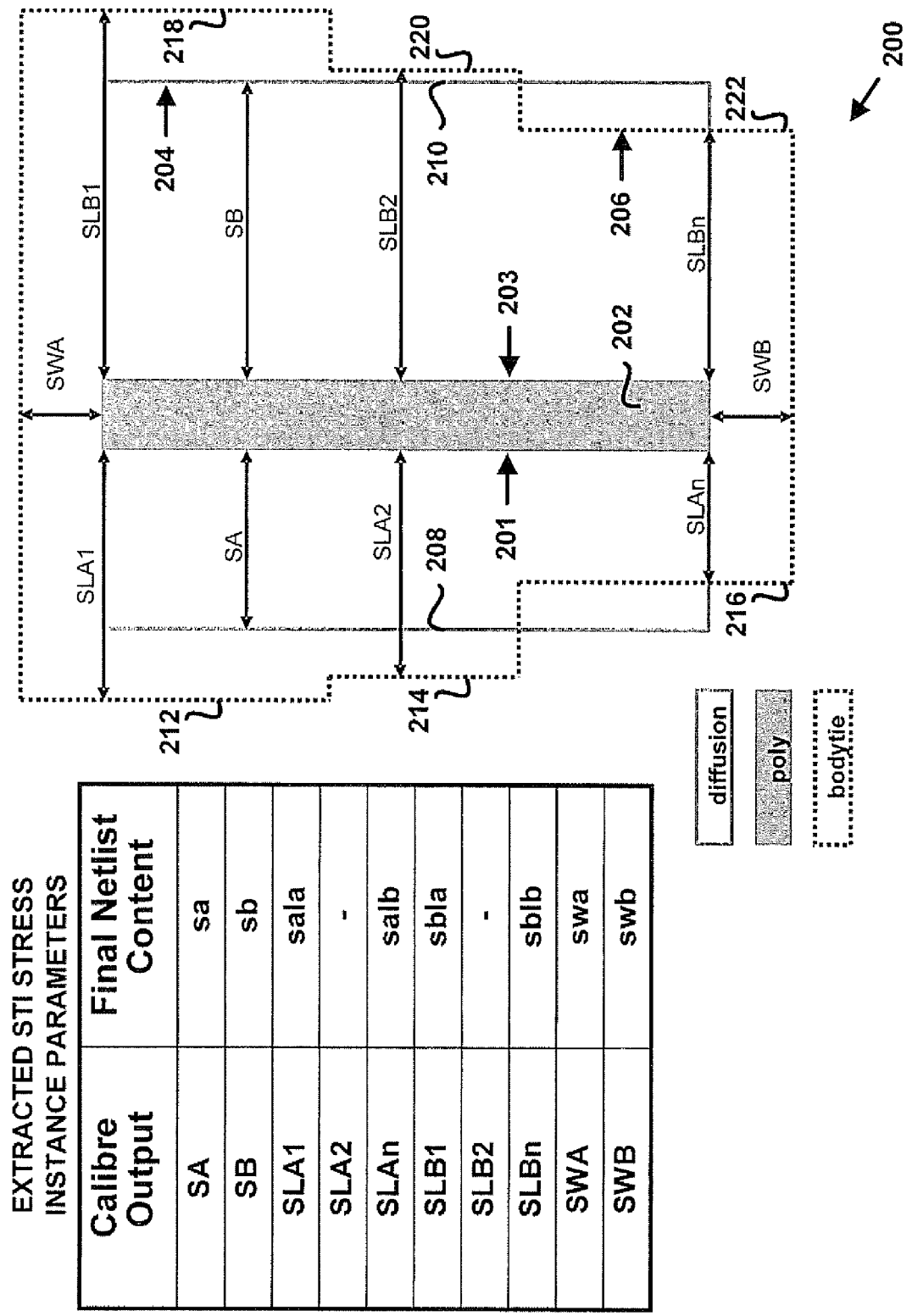
FIG. 2 is a device layout diagram identifying parameters for modeling STI stress effect in SOI technology, according to an example.

Preferably, eight instance parameters are created. The eight instance parameters created at block 102 may be SA, SB, SALA, SBLA, SALB, SBLB, SWA, and SWB. These instance parameters are depicted in FIG. 2. SA, SB, SALA, SBLA, SALB, and SBLB are used for stress extraction in the direction of current flow, while SWA and SWB are used for stress extraction perpendicular to the current flow. However, more or less than eight instance parameters may be created.

FIG. 2 is a device layout diagram 200 identifying parameters for modeling STI stress effect in SOI technology. The diagram 200 depicts a gate 202, a diffusion 204 (sometimes referred to as the active area), and a body-tie 206. The body tie 206 encloses the gate 202. The body tie 206 may enclose a length (L) of the gate 202 and a gate-end or width (W) of the gate 202.

SA and SB are measured using the diffusion 204. SA is measured from a first lateral edge 201 of the gate 202 to a first edge 208 of the diffusion 204 enclosing the gate 202. SB is measured from a second lateral edge 203 of the gate 202 to a second edge 210 of the diffusion 204 enclosing the gate 202. These instance parameters, SA and SB, impact performance of the entire channel of the device.

SLA1 to SLAn and SLB1 to SLBn are measured using distances between the body-tie 206 and a lateral edge of the gate 202. The variable "n" indicates each distance from the gate 202 to the body-tie 206. In FIG. 2, the edge of body-tie 206 is located at three distances from each lateral edge 201, 203 of the gate 202. As a result, in this example n=3. Of course, other body-tie designs may have different configurations than as depicted in FIG. 2.

SLA1 is measured from the first lateral edge 201 of the gate 202 to a first edge 212 of the body-tie 206 enclosing the gate 202. SLA2 is measured from the first lateral edge 201 of the gate 202 to a second edge 214 of the body-tie 206 enclosing the gate 202. SLAn is measured from the first lateral edge 201 of the gate 202 to a third edge 216 of the body-tie 206 enclosing the gate 202.

SLB1 is measured from the second lateral edge 203 of the gate 202 to a fourth edge 218 of the body-tie 206 enclosing the gate 202. SLB2 is measured from the second lateral edge 203 of the gate 202 to a fifth edge 220 of the body-tie 206 enclosing the gate 202. SLBn is measured from the second lateral edge 203 of the gate 202 to a sixth edge 222 of the body-tie 206 enclosing the gate 202.

These instance parameters, SLA1 to SLAn and SLB1 to SLBn, impact performance of the gate-end of the device. SL*1 and SL*n may be the only parameters kept for simulation as the SL*2 to SL*(n−1) parameters may not apply to the stress effects since they are internal to the device body.

SWA and SWB are measured using the distance from the gate-ends of the gate 202 to the body-tie 206. SWA is measured from the top end of the gate 202 to the top edge of the body-tie 206 enclosing the gate 202, while SWB is measured from the bottom end of the gate 202 to the bottom edge of the body-tie 206 enclosing the gate 202. However, not all body-ties enclose both gate ends.

Figure 3:
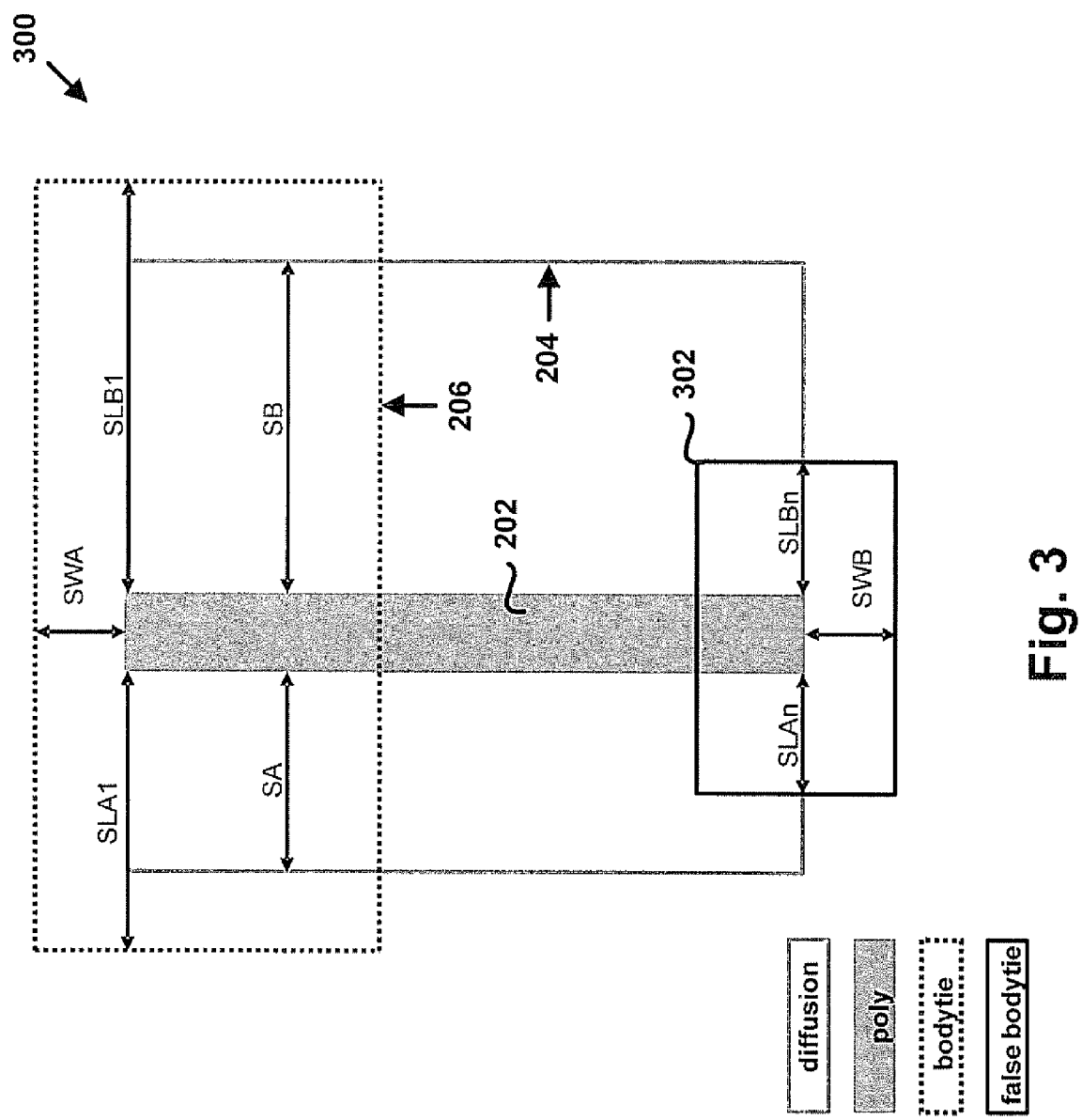
FIG. 3 is another device layout diagram identifying parameters for modeling STI stress effect in SOI technology, according to an example.

FIG. 3 is another device layout diagram 300 identifying parameters for modeling STI stress effect in SOI technology. The device layout diagram 300 shows the scenario of when the body-tie does not enclose one of the gate-ends. For example, PMOS is not required to have a body-tie that encloses both gate-ends. As provided in FIG. 4, a false body-tie feature 302 may be created in Calibre® to cause the software program to "think" that the body-tie encloses both gate-ends. This avoids the problem of Calibre® not being able to extract SL* and SW* without the false body-tie feature 302. The measured parameters from the false body-tie feature 302 have a negligible effect on the model.

Other changes made to the Calibre® code may include a weighted average calculation to handle the case when diffusion enclosure of gate-edge varies across the gate-edge. Additionally, a weighted average calculation may be added to the Calibre® code to handle the case when body-tie enclosure of gate-end varies across the gate-end. Further, design rules may be created to limit: 1) the body-tie enclosure of diffusion to 0.215 μm to minimize error of SA/SB extraction based on diffusion; and 2) the body-tie enclosure of the gate-end. Other modifications may also be made to the Calibre® code or other software package used to create instance parameters.

Returning to FIG. 1, at block 104, the instance parameters are added to a netlist. The table depicted in FIG. 2 includes Extracted STI Stress Instance Parameters. The first column of the table includes the instance parameters obtained from the well proximity effect capability. The second column of the table includes a modified list of instance parameters applicable to a mobility multiplier and is included in the final netlist content.

At block 106, the mobility multiplier is generated using the netlist with some or all of the instance parameters, and a lookup table or equation. For example, MULU0 is the mobility multiplier instance parameter in SPICE. The electron mobility and hole mobility are the average speed that electrons and holes diffuse through a semiconductor material with an electric field of 1 volt per meter applied across the material. In general, the higher the electron mobility the faster the transistor.

The lookup table may contain empirical data for mobility variation as a function of the eight instance parameters (SA, SB, SALA, SBLA, SALB, SBLB, SWA, and SWB) as well as MOSFET L and W. Alternatively, an equation that accounts for mobility variation as a function of the instance parameters, MOSFET L, and MOSFET W may be used.

At block 108, the mobility multiplier is added to the netlist and passed to the model. At block 110, the simulation is run using the netlist. The simulation is run with a circuit simulation program, such as SPICE. For example, the model may be the BSIM4 SPICE model. As a result, the STI stress effect in an SOI device can be modeled in such a way that accounts for the stress effects caused by the body-tie. The modeling results may benefit integrated circuit design and development.

The method described for modeling SOI stress effects may also be used for modeling other effects. For example, the method 100 may also be used for modeling different diffusion shapes. For example, the method 100 may be used to model a T-gate or H-gate structure. In this example, at block 102, instance parameters that define dimensions of a silicon enclosure of the gate and gate-end may be created in a similar manner as described with respect to the body-tie enclosure of gate and gate-end.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A method for modeling silicon-on-insulator shallow trench isolation stress effect, comprising in combination:
creating instance parameters that define dimensions of a body-tie enclosure of gate and gate-end;
adding the instance parameters to a netlist;
generating a mobility multiplier using the netlist;
adding the mobility multiplier to the netlist; and
running a circuit simulation program with the netlist that includes the instance parameters and the mobility multiplier.

2. The method of claim 1, wherein creating the instance parameters includes using a well proximity effect capability.

3. The method of claim 1, wherein creating the instance parameters includes using Calibre's well proximity effect capability.

4. The method of claim 1, wherein creating instance parameters includes creating eight instance parameters.

5. The method of claim 1, wherein creating instance parameters includes creating parameters used for stress extraction in a direction of current flow.

6. The method of claim 1, wherein creating instance parameters includes creating parameters used for stress extraction perpendicular to a direction of current flow.

7. The method of claim 1, further comprising creating dimensions of the body-tie enclosure of the gate-end when the body-tie does not enclose the gate-end.

8. The method of claim 1, wherein generating the mobility multiplier further includes using a table containing empirical data for mobility variation as a function of the instance parameters, a length of an active area of a transistor, and a width of the active area of the transistor.

9. The method of claim 1, wherein generating the mobility multiplier further includes using an equation that accounts for mobility variation as a function of the instance parameters, a length of an active area of a transistor, and a width of the active area of the transistor.

10. The method of claim 1, wherein running the circuit simulation program with the netlist that includes the instance parameters and the mobility multiplier includes using a SPICE model.

11. A system for modeling silicon-on-insulator shallow trench isolation stress effect, comprising in combination:
a processor;
data storage; and
machine language instructions stored in the data storage executable by the processor to:
create instance parameters that define dimensions of a body-tie enclosure of gate and gate-end;
add the instance parameters to a netlist;
generate a mobility multiplier using the netlist;
add the mobility multiplier to the netlist; and
run a circuit simulation program with the netlist that includes the instance parameters and the mobility multiplier.

12. The system of claim 11, wherein the instructions create the instance parameters using a well proximity effect capability.

13. The system of claim 11, wherein the instructions create the instance parameters using Calibre's well proximity effect capability.

14. The system of claim 11, wherein the instructions create instance parameters used for stress extraction in a direction of current flow.

15. The system of claim 11, wherein the instructions create instance parameters used for stress extraction perpendicular to a direction of current flow.

16. The system of claim 11, wherein the instructions further creates dimensions of the body-tie enclosure of gate and gate-end when the body-tie does not enclose the gate end.

17. The system of claim 11, wherein the instructions generate the mobility multiplier using a table containing empirical data for mobility variation as a function of the instance parameters, a length of an active area of a transistor, and a width of the active area of the transistor.

18. The system of claim 11, wherein the instructions generate the mobility multiplier using an equation that accounts for mobility variation as a function of the instance parameters, a length of an active area of a transistor, and a width of the active area of the transistor.

19. The system of claim 11, wherein the instructions use a SPICE simulation.

* * * * *